US010320400B2

(12) United States Patent
Yoo et al.

(10) Patent No.: US 10,320,400 B2
(45) Date of Patent: Jun. 11, 2019

(54) PHASE-LOCKED LOOP WITH HIGH BANDWIDTH USING RISING EDGE AND FALLING EDGE OF SIGNAL

(71) Applicant: Industry-University Cooperation Foundation Hanyang University, Seoul (KR)

(72) Inventors: Chang Sik Yoo, Seoul (KR); Baek Jin Lim, Incheon (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 15/768,305

(22) PCT Filed: Oct. 13, 2016

(86) PCT No.: PCT/KR2016/011470
§ 371 (c)(1),
(2) Date: Apr. 13, 2018

(87) PCT Pub. No.: WO2017/065510
PCT Pub. Date: Apr. 20, 2017

(65) Prior Publication Data
US 2018/0316359 A1    Nov. 1, 2018

(30) Foreign Application Priority Data
Oct. 15, 2015   (KR) .................. 10-2015-0143939

(51) Int. Cl.
*H03L 7/06*         (2006.01)
*H03L 7/08*         (2006.01)
(Continued)

(52) U.S. Cl.
CPC ............ *H03L 7/0891* (2013.01); *H03L 7/089* (2013.01); *H03L 7/093* (2013.01); *H03L 7/099* (2013.01)

(58) Field of Classification Search
CPC ........ H03L 7/0891; H03L 7/099; H03L 7/093
See application file for complete search history.

(56) References Cited

U.S. PATENT DOCUMENTS

| 6,933,790 B2 * | 8/2005 | Kiyose ................. G11B 7/0053 331/18 |
| 8,401,140 B2 * | 3/2013 | Mijuskovic .......... H03D 13/004 375/375 |

(Continued)

FOREIGN PATENT DOCUMENTS

| JP | 2007-116488 A | 5/2007 |
| KR | 10-2010-0137838 A | 12/2010 |

(Continued)

OTHER PUBLICATIONS

Office Action issued from Korean Patent Application No. 10-2015-0143939 dated Jul. 20, 2016.

(Continued)

*Primary Examiner* — Kenneth B Wells
(74) *Attorney, Agent, or Firm* — Sughrue Mion, PLLC (57) ABSTRACT

Disclosed is a phase-locked loop having a high bandwidth using the rising edge and falling edge of a signal. The disclosed phase-locked loop controls the frequency of a voltage control oscillator by comparing both a phase difference between rising edge of a reference signal and rising edge of a feedback signal and a phase difference between falling edge of the reference signal and falling edge of the feedback signal.

17 Claims, 5 Drawing Sheets

(51) Int. Cl.
*H03L 7/089* (2006.01)
*H03L 7/093* (2006.01)
*H03L 7/099* (2006.01)

(56) References Cited

U.S. PATENT DOCUMENTS 8,890,626 B2 * 11/2014 Chen .................... H03K 3/0315
327/156
2007/0082635 A1 4/2007 Gehring et al.

FOREIGN PATENT DOCUMENTS

| KR | 10-2011-0078477 A | 7/2011 |
|---|---|---|
| WO | 03/061130 A1 | 7/2003 |

OTHER PUBLICATIONS

Notice of Allowance issued from Korean Patent Application No. 10-2015-0143939 dated Jan. 19, 2017.
International Search Report for PCT/KR2016/011470 dated Jan. 10, 2017 [PCT/ISA/210].

\* cited by examiner

PHASE-LOCKED LOOP WITH HIGH BANDWIDTH USING RISING EDGE AND FALLING EDGE OF SIGNAL

TECHNICAL FIELD

Exemplary embodiments of the present invention relate to a phase-locked loop having a high bandwidth using a rising edge and a falling edge of a reference signal and a feedback signal.

BACKGROUND ART

A phase locked loop (PLL) is a frequency feedback circuit which generates an output signal having desired frequency and phase in response to a reference signal (clock signal) input from the outside, and has been frequently used for a frequency synthesis circuit, a clock recovery circuit, or the like.

Figure 1:
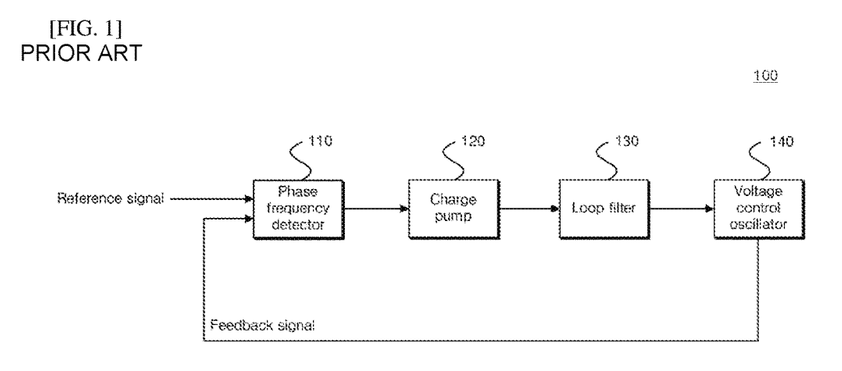
FIG. 1 is a diagram illustrating a schematic configuration of a phase-locked loop in the related art.

FIG. 1 is a diagram illustrating a schematic configuration of a charge pump type PLL as one example of a PLL in the related art.

Referring to FIG. 1, a charge pump type PLL 100 in the related art includes a phase frequency detector (PFD) 110, a charge pump (CP) 120, a loop filter 130, and a voltage control oscillator 140.

The PFD 110 compares a reference signal with a feedback signal to output a phase difference signal. The CP 120 supplies charges in proportion to a pulse width of a phase difference signal and the loop filter 130 varies the voltage with a change in accumulated charge amount. The voltage control oscillator 140 outputs a specific frequency based on a varied voltage, that is, a control voltage. The signal output from the voltage control oscillator 140 is fed-back to be input to the PFD 110. Generally, the PFD 110 compares rising edge of the reference signal with rising edge of the feedback signal or falling edge of the reference signal with falling edge of the feedback signal, and outputs a signal proportional to the phase difference.

Further, the PLL 100 may additionally provide a frequency divider (not illustrated). The frequency divider (not illustrated) is positioned on a feedback route and divides a frequency of an output signal output from the voltage control oscillator 140.

In the PLL in the related art, in order to improve phase and frequency detection speeds, a bandwidth of the PLL needs to be widened. However, in the PLL, in order to secure stability of the PLL due to a kind of sampling operation for detecting the phase difference in the rising edge or the falling edge of the reference signal and the feedback signal, the bandwidth of the PLL is generally limited to 1/10 or less of the reference signal frequency.

DISCLOSURE

Technical Problem

As described above, according to the related art, the bandwidth of the phase-locked loop is limited to 1/10 or less of the frequency of the reference signal. Therefore, an object of the present invention is provide a phase-locked loop capable of securing stability even though the bandwidth is 1/10 or more of the frequency of a reference signal by comparing both rising edges and falling edges of the reference signal and the feedback signal.

Other objects of the present invention will be drawn by those skilled in the art through the following exemplary embodiments.

Technical Solution

According to an aspect of the present invention to solve the objects, there is provided a phase-locked loop that controls a frequency of a voltage control oscillator by comparing both a phase difference between a reference signal and rising edge of a feedback signal and a phase difference between the reference signal and falling edge of the feedback signal.

The phase-locked loop comprises: a phase frequency detector that generates a rising edge phase difference signal which is a difference between the rising edge of the reference signal and the rising edge of the feedback signal, and a falling edge phase difference signal which is a difference between the falling edge of the reference signal and the falling edge of the feedback signal; a charge pump that supplies charges in proportion to a pulse width of the rising edge phase difference signal and supplies the charges in proportion to a pulse width of the falling edge phase difference signal; a loop filter that varies a voltage based on the supplied charges; and a voltage control oscillator that outputs a specific frequency based on the varied voltage.

Further, the phase-locked loop may additionally provide a frequency divider (not illustrated). The frequency divider (not illustrated) may be positioned on a feedback path and divide a frequency of an output signal output from the voltage control oscillator.

The phase frequency detector may output the rising edge phase difference signal and the falling edge phase difference signal within one period of the reference signal.

The phase frequency detector may comprise: a phase frequency detector A that receives the reference signal and the feedback signal and outputs the rising edge phase difference signal including a rising edge up signal and a rising edge down signal; a NOT circuit A that receives the reference signal and performs a NOT operation; a NOT circuit B that receives the feedback signal and performs a NOT operation; and a phase frequency detector B that receives an output value of the NOT circuit A and an output value of the NOT circuit B and outputs the falling edge phase difference signal including a falling edge up signal and a falling edge down signal.

The rising edge up signal may be a signal having a high value in an interval between the rising edge of the reference signal and the rising edge of the feedback signal when the rising edge of the reference signal is earlier than the rising edge of the feedback signal, and the rising edge down signal may be a signal having a high signal in an interval between the rising edge of the reference signal and the rising edge of the feedback signal when the rising edge of the reference signal is later than the rising edge of the feedback signal.

The falling edge up signal may be a signal having a high value in an interval between the falling edge of the reference signal and the falling edge of the feedback signal when the falling edge of the reference signal is earlier than the falling edge of the feedback signal, and the falling edge down signal may be a signal having a high signal in an interval between the falling edge of the reference signal and the falling edge of the feedback signal when the falling edge of the reference signal is later than the falling edge of the feedback signal.

The charge pump may comprise: a charge pump A that supplies the charges using the rising edge up signal and the rising edge down signal; and a charge pump B that supplies the charges using the falling edge up signal and the falling edge down signal, and the loop filter may comprise a proportional signal path; and an integrated signal path.

The charge pump A may comprise: a charge pump A1 and a charge pump A2 that supply charges to the proportional signal path of the rising edge up signal and the rising edge down signal; a charge pump A3 and a charge pump A4 that supply charges to the integrated signal path of the rising edge up signal and the rising edge down signal; and the charge pump B comprises: a charge pump B1 and a charge pump B2 that supply charges to the proportional signal path of the falling edge up signal and the falling edge down signal; and a charge pump B3 and a charge pump B4 that supply charges to the integrated signal path of the falling edge up signal and the falling edge down signal.

The proportional signal path may comprise a proportional signal circuit A and a proportional signal circuit B that have the same structure, and the integrated signal path may comprise an integrated signal circuit A and an integrated signal circuit B that have the same structure, wherein the proportional signal circuit A may be connected with the charge pump A1 and the charge pump B1, the proportional signal circuit B may be connected with the charge pump A2 and the charge pump B2, the integrated signal circuit A may be connected with the charge pump A3 and the charge pump B3, and the integrated signal circuit B may be connected with the charge pump A4 and the charge pump B4.

Each of the proportional signal circuit A and the proportional signal circuit B may comprise a capacitor A connected to an output end of the charge pump, a capacitor B connected to the capacitor A in parallel, switches A positioned between one end of the capacitor A and one end of the capacitor B, switches B positioned between one end of the capacitor A and the other end of the capacitor B, and switches C positioned between the other end of the capacitor B and an input end of the voltage control oscillator.

The switches B and the switches C may be simultaneously turned on/off, the switches A may be turned on for a predetermined time, and then the switches B and the switches C may be turned on for the predetermined time.

Each of the integrated signal circuit A and the integrated signal circuit B may comprise a capacitor C connected with the output end of the charge pump, a capacitor D connected with the capacitor C in parallel, and switches D positioned between one end of the capacitor C and one end of the capacitor D.

The switch A in the proportional signal circuit A and the switch D in the integrated signal circuit A may be simultaneously turned on/off and the switch A in the proportional signal circuit B and the switch D in the integrated signal circuit B may be simultaneously turned on/off.

According to another exemplary embodiment of the present invention, there is provided a phase-locked loop comprising: a phase frequency detector that generates a rising edge phase difference signal which is a difference between the rising edge of the reference signal and the rising edge of the feedback signal, and a falling edge phase difference signal which is a difference between the falling edge of the reference signal and the falling edge of the feedback signal; a charge pump that supplies charges in proportion to a pulse width of the rising edge phase difference signal and supplies the charges in proportion to a pulse width of the falling edge phase difference signal; a loop filter that has a plurality of capacitors and a plurality of switches and varies a voltage based on the supplied charges; a voltage control oscillator that outputs a specific frequency based on the varied voltage; and a frequency divider that divides an output signal of the voltage control oscillator to output the feedback signal, wherein the loop filter controls on/off of the plurality of switches to control the control voltages to be sampled at a first time point after the rising edge of the reference signal and at a second time point after the falling edge of the reference signal, respectively.

Advantageous Effects

According to the present invention, the phase-locked loop has an advantage of having a high bandwidth using rising edges and falling edges of the reference signal and the feedback signal.

BEST MODE

The present invention may have various modifications and various exemplary embodiments, and specific exemplary embodiments will be illustrated in drawings and described in detail in the detailed description. However, it should be understood that the present invention is not limited to specific exemplary embodiments, and the present invention covers all the modifications, equivalents and replacements included within the spirit and the technical scope of the present invention. In the description of each drawing, like reference numerals are used for like components.

Terms such as first, second, and the like may be used to describe various components, but the components should not be limited by the terms. The terms are used only for distinguishing one component from another component. For example, a first component may be referred to as a second component and similarly, the second component may also be referred to as the first component without departing from the scope of the present invention. A term 'and/or' includes a combination of a plurality of associated disclosed items or any item of the plurality of associated disclosed items.

It should be understood that, when it is described that a component is "connected to" or "accesses" another component, the component may also be directly connected to or access another component, but other components may also be present therebetween. In contrast, it should be understood that, when it is described that a component is "directly connected to" or "directly access" another component, other components are not present therebetween.

Hereinafter, example embodiments of the present invention will be described in more detail with reference to the accompanying drawings.

Figure 2:
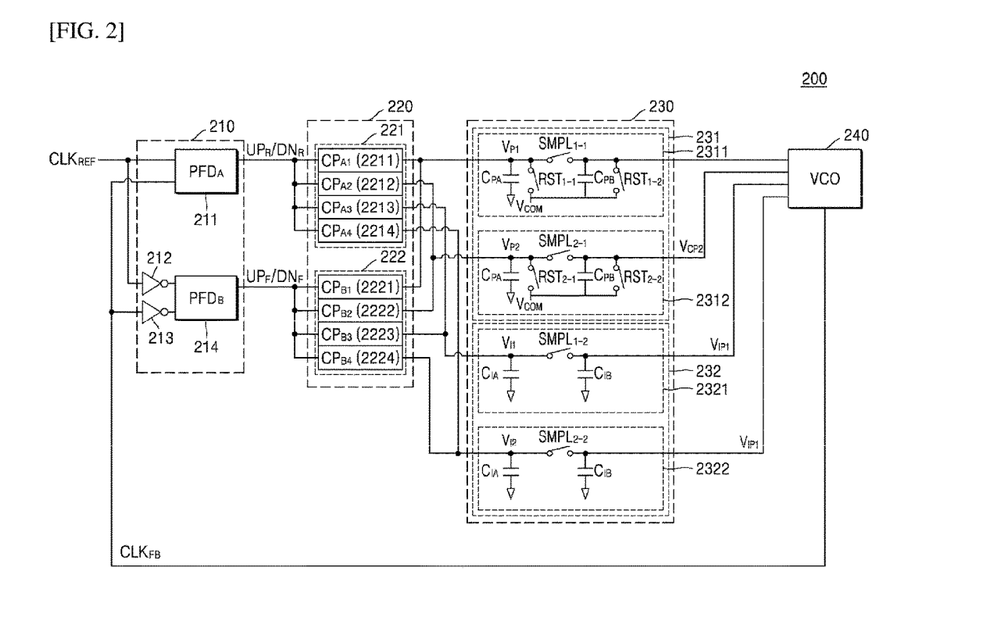
FIG. 2 is a diagram illustrating a schematic configuration of a phase-locked loop according to an exemplary embodiment of the present invention.
Figure 3:
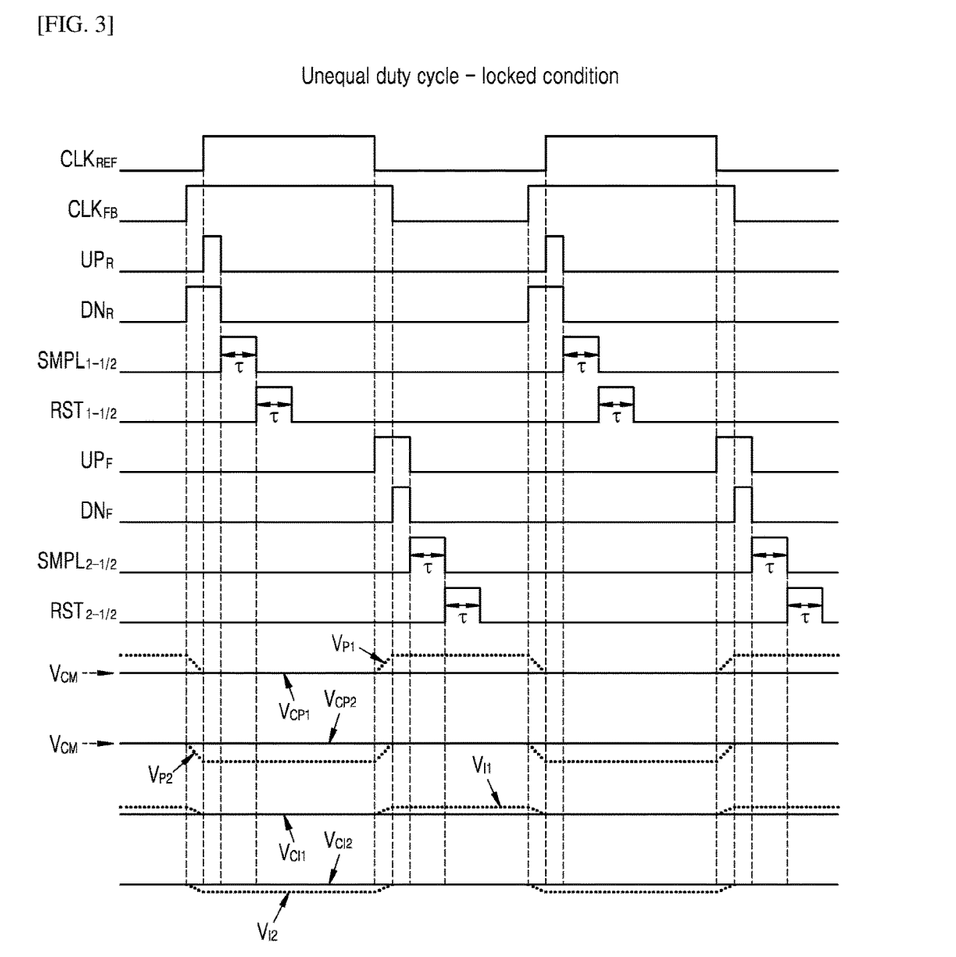
FIG. 3 is a diagram illustrating a clock diagram while duty cycles of a reference signal and a feedback signal are unequal to each other in a locked condition of the phase-locked loop according to the exemplary embodiment of the present invention.
Figure 4:
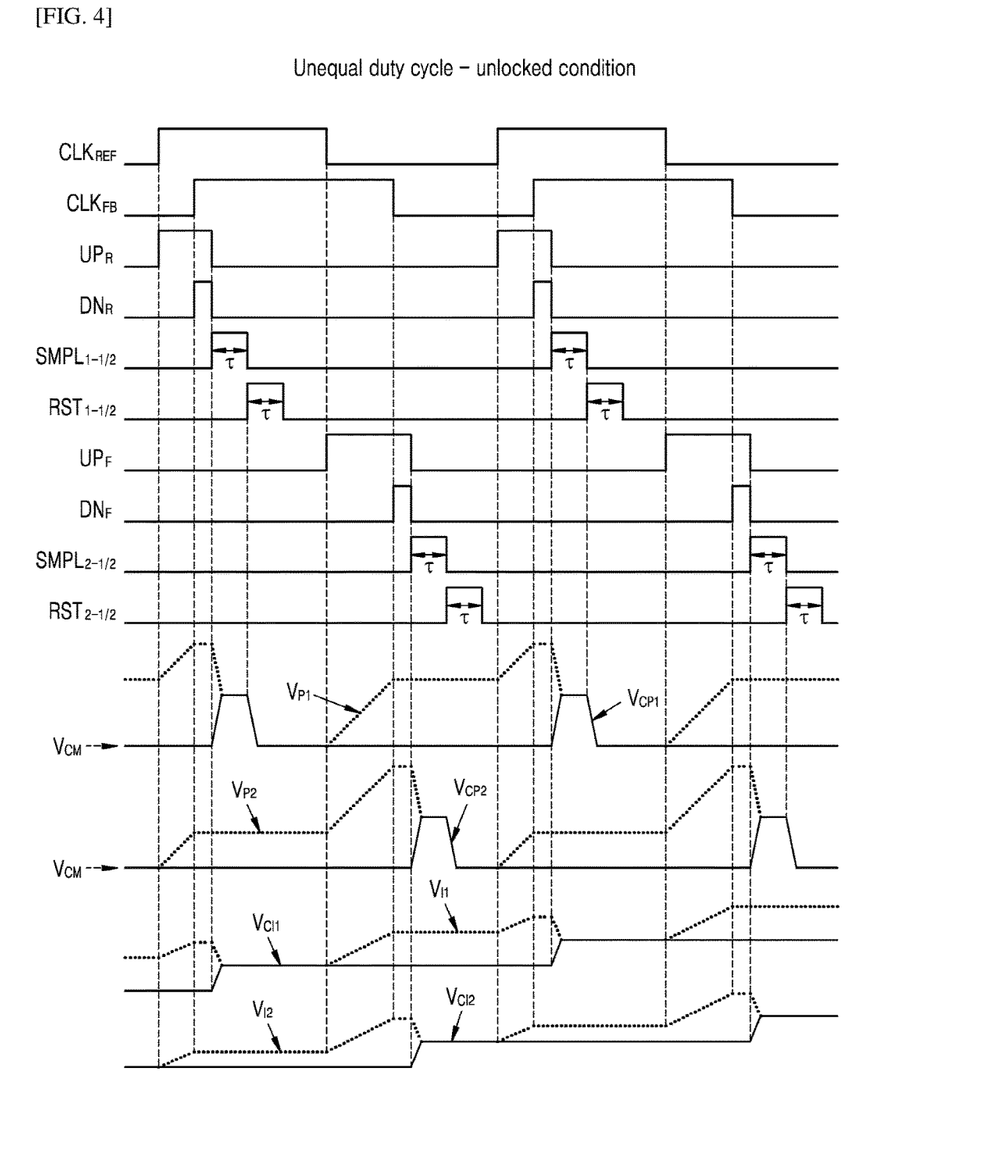
FIG. 4 is a diagram illustrating a clock diagram while duty cycles of a reference signal and a feedback signal are unequal to each other in an unlocked condition of the phase-locked loop according to the exemplary embodiment of the present invention.

FIG. 2 is a diagram illustrating a schematic configuration of a phase-locked loop according to an exemplary embodiment of the present invention, FIG. 3 is a diagram illustrating a clock diagram while duty cycles of a reference signal and a feedback signal are unequal to each other in a locked condition of the phase-locked loop according to the exemplary embodiment of the present invention, and FIG. 4 is a diagram illustrating a clock diagram while duty cycles of a reference signal and a feedback signal are unequal to each other in an unlocked condition of the phase-locked loop according to the exemplary embodiment of the present invention.

Meanwhile, a case where the duty of the reference signal is the same as the duty of the feedback signal is included in a case where the duty of the reference signal and the duty of the feedback signal are unequal to each other, hereinafter, the present invention will be described base on the case where the duty cycles of the reference signal and the feedback signal are unequal to each other.

First, referring to FIG. 2, a phase-locked loop 200 according to an exemplary embodiment of the present invention includes a phase frequency detector (PFD) 210, a charge pump 220, a loop filter 230, and a voltage control oscillator (VCO) 240.

The PFD 210 generates a phase difference signal by comparing a reference signal $CLK_{REF}$ and a feedback signal $CLK_{FB}$.

In this case, as illustrated in FIG. 2, the feedback signal may be a signal output from the VCO 240. Meanwhile, according to another example, the phase-locked loop 200 may additionally include a frequency divider (not illustrated) which is positioned on a feedback route and divides a signal output from the VCO 240, and the feedback signal may also be an output signal of the frequency divider (not illustrated).

In more detail, the PFD 210 generates a rising edge phase difference signal $UP_R/DN_R$ which is a difference between rising edge of the reference signal $CLK_{REF}$ and rising edge of the feedback signal $CLK_{FB}$ and a falling edge phase difference signal $UP_F/DN_F$ which is a difference between falling edge of the reference signal $CLK_{REF}$ and falling edges of the feedback signal $CLK_{FB}$.

To this end, the PFD 210 outputs the rising edge phase difference signal $UP_R/DN_R$ and the falling edge phase difference signal $UP_F/DN_F$ within one period clock of the reference signal $CLK_{REF}$, and two phase frequency detectors are included for such a operation.

Particularly, the PFD 210 includes a phase frequency detector A 211, a NOT circuit A 212, a NOT circuit B 213, and a phase frequency detector B 214.

The phase frequency detector A 211 receives the reference signal $CLK_{REF}$ and the feedback signal $CLK_{FB}$ and outputs the rising edge phase difference signal $UP_R/DN_R$.

The NOT circuit A 212 receives the reference signal $CLK_{REF}$ and performs a NOT operation and the NOT circuit B 213 receives the feedback signal $CLK_{FB}$ and performs a NOT operation. In addition, the phase frequency detector B 214 receives an output value of the NOT circuit A 212 and an output value of the NOT circuit B 213 and outputs the falling edge phase difference signal $UP_F/DN_F$. That is, the phase frequency detector B 214 receives an inverted reference signal $CLK_{REF}$ and an inverted feedback signal $CLK_{FB}$ to output an inverted falling edge phase difference signal $UP_F/DN_F$.

Herein, the rising edge phase difference signal $UP_R/DN_R$ includes a rising edge up signal $UP_R$ and a rising edge down signal $DN_R$ and the falling edge phase difference signal $UP_F/DN_F$ includes a falling edge up signal $UP_F$ and a falling edge down signal $DN_F$.

Hereinafter, respective signals will be described in detail with reference to FIG. 3.

First, the rising edge up signal $UP_R$ is a signal having a high value in an interval between the rising edge of the reference signal $CLK_{REF}$ and the rising edge of the feedback signal $CLK_{FB}$ when the rising edge of the reference signal $CLK_{REF}$ is earlier than the rising edge of the feedback signal $CLK_{FB}$, and the rising edge down signal $DN_R$ is a signal having a high signal in an interval between the rising edge of the reference signal $CLK_{REF}$ and the rising edge of the feedback signal $CLK_{FB}$ when the rising edge of the reference signal $CLK_{REF}$ is later than the rising edge of the feedback signal $CLK_{FB}$.

Next, the falling edge up signal $UP_F$ is a signal having a high value in an interval between the falling edge of the reference signal $CLK_{REF}$ and the falling edge of the feedback signal $CLK_{FB}$ when the falling edge of the reference signal $CLK_{REF}$ is earlier than the falling edge of the feedback signal $CLK_{FB}$, and the falling edge down signal $DN_F$ is a signal having a high signal in an interval between the falling edge of the reference signal $CLK_{REF}$ and the falling edge of the feedback signal $CLK_{FB}$ when the falling edge of the reference signal $CLK_{REF}$ is later than the falling edge of the feedback signal $CLK_{FB}$.

The charge pump 220 supplies charges in proportion to a pulse width of the rising edge phase difference signal $UP_R/DN_R$ and supplies the charges in proportion to a pulse width of the falling edge phase difference signal $UP_F/DN_F$. That is, the charge pump 220 includes a charge pump A 221 that supplies the charges using the rising edge phase difference signal $UP_R/DN_R$ and a charge pump B 220 that supplies the charges using the falling edge phase difference signal $UP_F/DN_F$.

In addition, the loop filter 230 varies a voltage based on the charges supplied from the charge pump 220. Herein, the loop filter 230 is a structure of a switch capacitor including a plurality of capacitors and a plurality of switches and includes a proportional signal path 231 and an integrated signal path 232.

Hereinafter, the charge pump 220 and the loop filter 230 will be described in detail with reference to FIGS. 2 to 4.

The charge pump A 221 may include a charge pump A1 2211 and a charge pump A2 2212 that supply charges to the proportional signal path 231 of the rising edge up signal $UP_R$ and the rising edge down signal $DN_R$, and a charge pump A3 2213 and a charge pump A4 2214 that supply charges to the integrated signal path 232 of the rising edge up signal $UP_R$ and the rising edge down signal $DN_R$.

In addition, the charge pump B 222 may include a charge pump B1 2221 and a charge pump B2 2222 that supply charges to the proportional signal path 231 of the falling edge up signal $UP_F$ and the falling edge down signal $DN_F$, and a charge pump B3 2223 and a charge pump B4 2224 that supply charges to the integrated signal path 232 of the falling edge up signal $UP_F$ and the falling edge down signal $DN_F$.

Further, the proportional signal path 231 includes a proportional signal circuit A 2311 and a proportional signal circuit B 2312 that have the same structure, and the integrated signal path 232 may include an integrated signal circuit A 2321 and an integrated signal circuit B 2322 that have the same structure. In this case, the proportional signal circuit A 2311 may be connected with the charge pump A1

2211 and the charge pump B1 2221, the proportional signal circuit B 2312 may be connected with the charge pump A2 2212 and the charge pump B2 2222, the integrated signal circuit A 2321 may be connected with the charge pump A3 2213 and the charge pump B3 2223, and the integrated signal circuit B 2322 may be connected with the charge pump A4 2214 and the charge pump B4 2224.

In addition, each of the proportional signal circuit A 2311 and the proportional signal circuit B 2312 may include a capacitor A $C_{PA}$ connected to an output end of the charge pump 220, a capacitor B $C_{PB}$ connected to the capacitor A $C_{PA}$ in parallel, switches A $SMPL_{1-1}$ and $SMPL_{2-1}$ positioned between one end of the capacitor A $C_{PA}$ and one end of the capacitor B $C_{PB}$, switches B $RST_{1-1}$ and $RST_{2-1}$ positioned between one end of the capacitor A $C_{PA}$ and the other end of the capacitor B $C_{PB}$, and switches C $RST_{1-2}$ and $RST_{2-2}$ positioned between the other end of the capacitor B $C_{PB}$ and an input end of the VCO 240.

In this case, referring to FIGS. 3 and 4, the switches B $RST_{1-1}$ and $RST_{2-1}$ and the switches C $RST_{1-2}$ and $RST_{2-2}$ are simultaneously turned on/off, the switches A $SMPL_1$ and $SMPL_2$ are turned on for a predetermined time τ, and then the switches B $RST_{1-1}$ and $RST_{2-1}$ and the switches C $RST_{1-2}$ and $RST_{2-2}$ may be turned on for the predetermined time τ.

Further, each of the integrated signal circuit A 2321 and an integrated signal circuit B 2322 may include a capacitor C $C_{IA}$ connected with the output end of the charge pump 220, a capacitor D $C_D$ connected with the capacitor C $C_{IA}$ in parallel, and switches D $SMPL_{1-2}$ and $SMPL_{2-2}$ positioned between one end of the capacitor C $C_{IA}$ and one end of the capacitor D $C_m$.

Herein, referring to FIGS. 3 and 4, the switch A $SMPL_{1-1}$ in the proportional signal circuit A 2311 and the switch D $SMPL_{1-2}$ in the integrated signal circuit A 2321 are simultaneously turned on/off and the switch A $SMPL_{2-1}$ in the proportional signal circuit B 2312 and the switch D $SMPL_{2-2}$ in the integrated signal circuit B 2322 may be simultaneously turned on/off.

The VCO 240 output a specific frequency by setting the varied voltage output through the loop filter 230 as a control voltage. In this case, the output end of the proportional signal circuit A 2311, the output end of the proportional signal circuit B 2312, the output end of the integrated signal circuit A 2321 and the output end of the integrated signal circuit B 2322 are connected to the input end of the voltage controlled oscillator 240.

For example, the present invention has advantages of using both rising edge phase difference information signals of the reference signal and the feedback signal and falling edge phase difference information signals of the reference signal and the feedback signal within one period of the reference signal and extending a bandwidth of the phase-locked loop to two times (for example, ⅒->⅕) larger than that of the related art, by using the two phase frequency detectors 211 and 212.

Further, in the present invention, control voltages $V_{CP1}$, $V_{CP2}$, $V_{CI1}$, and $V_{CI1}$ of the VCO 240 may be controlled to be sampled at a first time point after the rising edge of the reference signal $CLK_{REF}$ and a second time point after the falling edge of the $CLK_{REF}$ through the operation described above, particularly, the operation control of the loop filter 230. Accordingly, as illustrated in FIG. 3, even though the duty cycles of the reference signal $CLK_{REF}$ and the feedback signal $CLK_{FB}$ are equal or unequal to each other, there is an advantage in that while the phase-locked loop 200 is locked, no noise or ripple occurs in the control voltage of the VCO 240.

Herein, referring to FIGS. 3 and 4, the first time point is a time point at which the output end of the proportional signal circuit A 2311 and the output end of the integrated signal circuit A 2321 are sampled, and the time point at which the switch A $SMPL_{1-1}$ of the proportional signal circuit A 2311 is turned on and the time point at which the switch D $SMPL_{1-2}$ of the integrated signal circuit A 2321 is turned on may be the first time point. Further, the second time point is a time point at which the output end of the proportional signal circuit B 2321 and the output end of the integrated signal circuit B 2322 are sampled, and the time point at which the switch A $SMPL_{2-1}$ of the proportional signal circuit B 2321 is turned on and the time point at which the switch D $SMPL_{2-2}$ of the integrated signal circuit B 2322 is turned on may be the second time point.

In summary, while the phase-locked loop is locked, in the feedback signal and the reference signal, the phase difference between the rising edge of the two signals and the phase difference between the rising edge and the falling edge of the two signals have the same absolute size and opposite signs. Accordingly, the pulse width of the rising edge up signal $UP_R$ and the pulse width of the falling edge down signal $DN_F$ are the same as each other or the pulse width of the rising edge down signal $DN_R$ and the pulse width of the falling edge up signal $UP_F$ are the same as each other, and the charge amount of the charge pump driven by the rising edge and the charge pump driven by the falling edge is the same as the charge amount charged/discharged in the capacitors A $C_{PA}$ and C $C_{IA}$ of the loop filter 230. As a result, in the locked condition, there is an advantage in that no ripple of the control voltage of the VCO 240 occurs.

Figure 5:
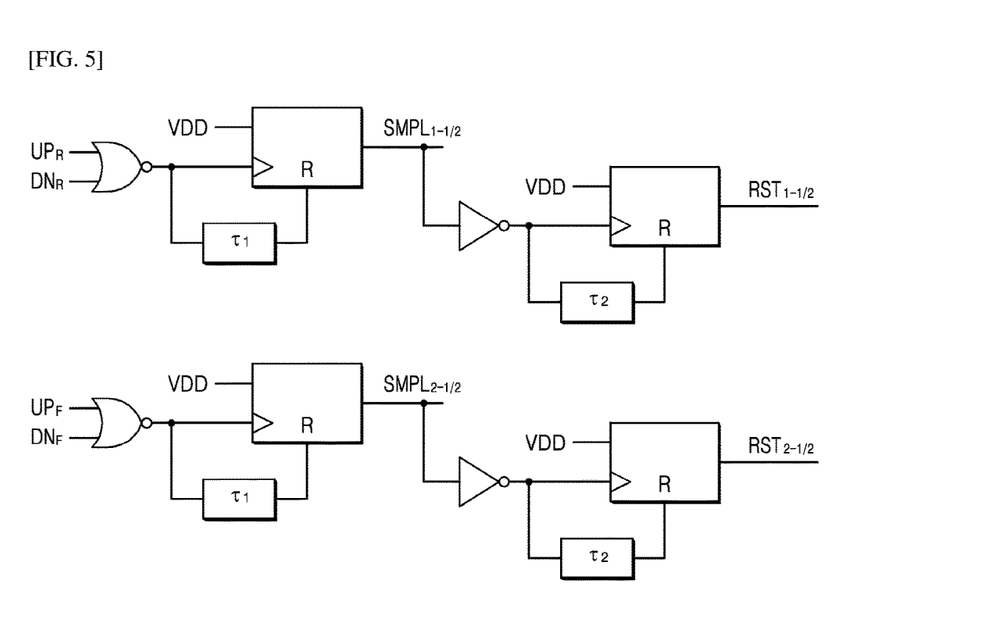
FIG. 5 is a diagram illustrating a circuit diagram in which a control signal of a switch is generated in a loop filter according to the exemplary embodiment of the present invention.

Meanwhile, FIG. 5 is a diagram illustrating a circuit diagram in which the control signal of the switch is generated in the loop filter 230 according to the exemplary embodiment of the present invention. Referring to FIG. 5, controls signals of the switches may be generated using the rising edge up signal $UP_R$/rising edge down signal $DN_R$ and the falling edge up signal $UP_F$/falling edge down signal $DN_F$, which are the output signals of the two phase frequency detectors 221 and 224.

As described above, the present invention has been described by the specified matters such as specific components and the limited exemplary embodiments and drawings, which are just provided to help the overall understanding of the present invention, and the present invention is not limited to the exemplary embodiments, and those skilled in the art will appreciate that various modifications and changes can be made from the disclosure. Therefore, the spirit of the present invention is not limited to the exemplary embodiments described above, and it should be appreciated that all equal or equivalent modifications as well as the appended claims to be described below belong to the spirit of the present invention.

The invention claimed is:
1. A phase-locked loop comprising:
 a phase frequency detector that generates a rising edge phase difference signal which indicates a difference between a rising edge of a reference signal and a rising edge of a feedback signal, and a falling edge phase difference signal which indicates a difference between a falling edge of the reference signal and a falling edge of the feedback signal;
 a charge pump that supplies charges in proportion to a pulse width of the rising edge phase difference signal and supplies the charges in proportion to a pulse width of the falling edge phase difference signal;

a loop filter that varies a voltage based on the supplied charges; and a voltage control oscillator that outputs a specific frequency based on the varied voltage, wherein the phase frequency detector comprises a phase frequency detector A that receives the reference signal and the feedback signal and outputs the rising edge phase difference signal including a rising edge up signal and a rising edge down signal; a NOT circuit A that receives the reference signal and performs a NOT operation; a NOT circuit B that receives the feedback signal and performs a NOT operation; and a phase frequency detector B that receives an output value of the NOT circuit A and an output value of the NOT circuit B and outputs the falling edge phase difference signal including a falling edge up signal and a falling edge down signal, wherein the charge pump comprises a charge pump A that supplies the charges using the rising edge up signal and the rising edge down signal; and a charge pump B that supplies the charges using the falling edge up signal and the falling edge down signal, and wherein the loop filter comprises a proportional signal path; and an integrated signal path.

2. The phase-locked loop of claim 1, wherein the phase frequency detector outputs the rising edge phase difference signal and the falling edge phase difference signal within one period of the reference signal.

3. The phase-locked loop of claim 1, wherein the rising edge up signal is a signal having a high value between the rising edge of the reference signal and the rising edge of the feedback signal when the rising edge of the reference signal is earlier than the rising edge of the feedback signal, and the rising edge down signal is a signal having a high signal in an interval between the rising edge of the reference signal and the rising edge of the feedback signal when the rising edge of the reference signal is later than the rising edge of the feedback signal.

4. The phase-locked loop of claim 1, wherein the falling edge up signal is a signal having a high value in an interval between the falling edge of the reference signal and the falling edge of the feedback signal when the falling edge of the reference signal is earlier than the falling edge of the feedback signal, and the falling edge down signal is a signal having a high signal in an interval between the falling edge of the reference signal and the falling edge of the feedback signal when the falling edge of the reference signal is later than the falling edge of the feedback signal.

5. The phase-locked loop of claim 1, wherein the charge pump A comprises: a charge pump A1 and a charge pump A2 that supply charges to the proportional signal path of the rising edge up signal and the rising edge down signal; a charge pump A3 and a charge pump A4 that supply charges to the integrated signal path of the rising edge up signal and the rising edge down signal; and the charge pump B comprises: a charge pump B1 and a charge pump B2 that supply charges to the proportional signal path of the falling edge up signal and the falling edge down signal; and a charge pump B3 and a charge pump B4 that supply charges to the integrated signal path of the falling edge up signal and the falling edge down signal.

6. The phase-locked loop of claim 5, wherein the proportional signal path comprises a proportional signal circuit A and a proportional signal circuit B that have the same structure, and the integrated signal path comprises an integrated signal circuit A and an integrated signal circuit B that have the same structure, wherein the proportional signal circuit A is connected with the charge pump A1 and the charge pump B1, the proportional signal circuit B is connected with the charge pump A2 and the charge pump B2, the integrated signal circuit A is connected with the charge pump A3 and the charge pump B3, and the integrated signal circuit B is connected with the charge pump A4 and the charge pump B4.

7. The phase-locked loop of claim 6, wherein each of the proportional signal circuit A and the proportional signal circuit B comprises a capacitor A connected to an output end of the charge pump, a capacitor B connected to the capacitor A in parallel, a switch A positioned between one end of the capacitor A and one end of the capacitor B, a switch B positioned between one end of the capacitor A and the other end of the capacitor B, and a switch C positioned between the other end of the capacitor B and an input end of the voltage control oscillator.

8. The phase-locked loop of claim 7, wherein the switches B and C are simultaneously turned on/off, the switch A is turned on for a predetermined time, and then the switches B and C are turned on for the predetermined time.

9. The phase-locked loop of claim 8, wherein each of the integrated signal circuit A and the integrated signal circuit B comprises a capacitor C connected with the output end of the charge pump, a capacitor D connected with the capacitor C in parallel, and a switch D positioned between one end of the capacitor C and one end of the capacitor D.

10. The phase-locked loop of claim 9, wherein the switch A in the proportional signal circuit A and the switch D in the integrated signal circuit A are simultaneously turned on/off and the switch A in the proportional signal circuit B and the switch D in the integrated signal circuit B are simultaneously turned on/off.

11. A phase-locked loop comprising:

a phase frequency detector that generates a rising edge phase difference signal which indicates a difference between a rising edge of a reference signal and a rising edge of a feedback signal, and a falling edge phase difference signal which indicates a difference between a falling edge of the reference signal and a falling edge of the feedback signal;

a charge pump that supplies charges in proportion to a pulse width of the rising edge phase difference signal and supplies the charges in proportion to a pulse width of the falling edge phase difference signal;

a loop filter that has a plurality of capacitors and a plurality of switches and varies a voltage based on the supplied charges;

a voltage control oscillator that outputs a specific frequency based on a control voltage corresponding to the varied voltage; and a frequency divider that divides an output signal of the voltage control oscillator and outputs the feedback signal, wherein the loop filter comprises a proportional signal path constituted by a proportional signal circuit A and a proportional signal circuit B; and an integrated signal path constituted by an integrated signal circuit A and an integrated signal circuit B, wherein an output end of the proportional signal circuit A, an output end of the proportional signal circuit B, an output end of the integrated signal circuit A and an output end of the integrated signal circuit B are connected to an input end of the voltage controlled oscillator, and wherein the loop filter controls on/off of the plurality of switches so that the control voltage is sampled at a first time point after the rising edge of the reference signal and at a second time point after the falling edge of the reference signal, respectively, wherein the first time point is a time point at which the output end of the proportional signal circuit A and the output end of the integrated signal circuit A are sampled, and the second time point is a time point at which the output end of the proportional signal circuit B and the output end of the integrated signal circuit B are sampled.

12. The phase-locked loop of claim 11, wherein each of the proportional signal circuit A and the proportional signal circuit B comprises a capacitor A connected to an output end of the charge pump, a capacitor B connected to the capacitor A in parallel, a switch A positioned between one end of the capacitor A and one end of the capacitor B, a switch B positioned between one end of the capacitor A and the other end of the capacitor B, and a switch C positioned between the other end of the capacitor B and an input end of the voltage control oscillator.

13. The phase-locked loop of claim 12, wherein each of the integrated signal circuit A and the integrated signal circuit B comprises a capacitor C connected with the output end of the charge pump, a capacitor D connected with the capacitor C in parallel, and a switch D positioned between one end of the capacitor C and one end of the capacitor D.

14. The phase-locked loop of claim 13, wherein in each of the proportional signal circuit A and the proportional signal circuit B, the switches B and C are turned on/off in the same manner, the switch A is turned on for a predetermined time, and then the switches B and C are turned on for the predetermined time, and the switch A in the proportional signal circuit A and the switch D in the integrated signal circuit A are simultaneously turned on/off and the switch A in the proportional signal circuit B and the switch D in the integrated signal circuit B are simultaneously turned on/off.

15. The phase-locked loop of claim 14, wherein the first time point is a time point when the switch A in the proportional signal circuit A and the switch D in the integral signal circuit A are turned on, and the second time point is the switch A in the proportional signal circuit B and the switch D in the integrated signal circuit B are turned on.

16. The phase-locked loop of claim 14, wherein the charge pump comprises a charge pump A that supplies the charges using a rising edge up signal and a rising edge down signal; and a charge pump B that supplies the charges using a falling edge up signal and a falling edge down signal, wherein the charge pump A comprises: a charge pump A1 and a charge pump A2 that supply charges to the proportional signal circuit A corresponding to the rising edge up signal and the rising edge down signal; a charge pump A3 and a charge pump A4 that supply charges to the integrated signal circuit A corresponding to the rising edge up signal and the rising edge down signal, and the charge pump B comprises: a charge pump B1 and a charge pump B2 that supply charges to the proportional signal circuit A corresponding to the falling edge up signal and the falling edge down signal; and a charge pump B3 and a charge pump B4 that supply charges to the integrated signal circuit A corresponding to the falling edge up signal and the falling edge down signal.

17. The phase-locked loop of claim 11, wherein the phase frequency detector comprises:

a phase frequency detector A that receives the reference signal and the feedback signal and outputs the rising edge phase difference signal including a rising edge up signal and a rising edge down signal;

a NOT circuit A that receives the reference signal and performs a NOT operation;

a NOT circuit B that receives the feedback signal and performs a NOT operation; and a phase frequency detector B that receives an output value of the NOT circuit A and an output value of the NOT circuit B and outputs the falling edge phase difference signal including a falling edge up signal and a falling edge down signal.

* * * * *